United States Patent
Müller

(10) Patent No.: US 10,872,905 B2
(45) Date of Patent: Dec. 22, 2020

(54) INTEGRATED CIRCUIT INCLUDING A FERROELECTRIC MEMORY CELL AND MANUFACTURING METHOD THEREOF

(71) Applicant: NaMLab gGmbH, Dresden (DE)

(72) Inventor: Stefan Müller, Dresden (DE)

(73) Assignee: NamLab gGmbh, Dresden (DE)

(*) Notice: Subject to any disclaimer, the term of this patent is extended or adjusted under 35 U.S.C. 154(b) by 103 days.

(21) Appl. No.: 15/838,011

(22) Filed: Dec. 11, 2017

(65) Prior Publication Data
US 2018/0166453 A1     Jun. 14, 2018

(30) Foreign Application Priority Data

Dec. 14, 2016 (DE) ........................ 10 2016 015 010

(51) Int. Cl.
*H01L 27/1159* (2017.01)
*H01L 29/78* (2006.01)
(Continued)

(52) U.S. Cl.
CPC .... *H01L 27/1159* (2013.01); *H01L 27/11507* (2013.01); *H01L 28/40* (2013.01);
(Continued)

(58) Field of Classification Search
CPC ..... H01L 27/1159; H01L 28/40; H01L 21/28; H01L 49/02; H01L 29/78; H01L 29/66;
(Continued)

(56) References Cited

U.S. PATENT DOCUMENTS 7,709,359 B2    5/2010  Boescke et al.
9,793,397 B1*  10/2017  Ando ................. H01L 29/4966
(Continued)

FOREIGN PATENT DOCUMENTS

DE      10352655 A1    6/2005
DE   102015015854 A1   6/2017
WO       0171816 A1    9/2001

OTHER PUBLICATIONS

Shirai et al., "Structural Properties and Surface Characteristics on Aluminum Oxide Powders", Ceramics Research Laboratory, Nagoya Institute of Technology, vol. 9, pp. 23-31. (Year: 2009).*
(Continued)

*Primary Examiner* — Steven H Loke
*Assistant Examiner* — Juanita B Rhodes
(74) *Attorney, Agent, or Firm* — Edell, Shapiro & Finnan, LLC.

(57) ABSTRACT

An integrated circuit comprises a ferroelectric memory cell comprising a ferroelectric film comprising a binary oxide ferroelectric with the formula $XO_2$ where X represents a transition metal. The ferroelectric film is a polycrystalline film having a plurality of crystal grains, wherein the crystal grains are oriented along a predetermined crystal axis, or the ferroelectric film is a monocrystalline film, wherein the ferroelectric film comprises additives promoting formation of the crystal structure of the monocrystalline film and/or wherein the memory cell comprises a crystallinity-promoting layer that is directly in contact with the ferroelectric film and promotes formation of the crystal structure of the monocrystalline film.

14 Claims, 3 Drawing Sheets

(51) Int. Cl.
  H01L 29/51      (2006.01)
  H01L 27/11507   (2017.01)
  H01L 29/66      (2006.01)
  H01L 49/02      (2006.01)
  H01L 21/28      (2006.01)
(52) U.S. Cl.
  CPC ........ *H01L 28/60* (2013.01); *H01L 29/40111* (2019.08); *H01L 29/516* (2013.01); *H01L 29/6684* (2013.01); *H01L 29/78391* (2014.09)
(58) Field of Classification Search
  CPC ............... H01L 29/51; H01L 27/11507; H01L 29/78391; H01L 21/28291; H01L 29/6684; H01L 28/60; H01L 29/516; H01L 29/40111; C23C 14/08
  See application file for complete search history.

(56) References Cited

U.S. PATENT DOCUMENTS

| | | | | |
|---|---|---|---|---|
| 2001/0051436 | A1 | 12/2001 | Kim | |
| 2009/0261395 | A1* | 10/2009 | Boescke | H01L 21/02181 257/295 |
| 2010/0015729 | A1* | 1/2010 | Choi | H01L 21/3105 438/3 |
| 2010/0096666 | A1* | 4/2010 | Ishida | H01L 41/318 257/190 |
| 2011/0108899 | A1* | 5/2011 | Jonas | G11C 11/22 257/295 |
| 2014/0254275 | A1 | 9/2014 | Shuto | |
| 2014/0355328 | A1* | 12/2014 | Muller | G11C 11/2273 365/145 |
| 2015/0214322 | A1* | 7/2015 | Mueller | H01L 21/0228 257/295 |
| 2015/0340372 | A1 | 11/2015 | Pandey et al. | |
| 2016/0005961 | A1 | 1/2016 | Ino | |
| 2016/0064510 | A1* | 3/2016 | Mueller | H01L 29/78391 257/295 |
| 2016/0365133 | A1* | 12/2016 | Ino | G11C 11/223 |

OTHER PUBLICATIONS

Polakowski etal., "Ferroelectricity in undoped hafnium oxide", Appl. Phys. Lett. 106, 232905 (2015), pp. 232905-1 to 232905-5. (Year: 2015).*
Chiu, Y., et al., "Low Power 1T DRAM/NVM Versatile Memory Featuring Steep Sub-60-mV/decade Operation, Fast 20-ns Speed, and Robust 850° C.-Extrapolated 1016 Endurance," 2015 Symposium on VLSI Technology, VLSI Technology 2015—Digest of Technical Papers, pp. T184-T185 (Aug. 2015).
Fabris, S., et al., "A Stabilization Mechanism of Zirconia Based on Oxygen Vacancies Only," arXiv:cond-mat/0206080v1 [cond-mat. mtrl-sci], pp. 1-4 (Jun. 2002).
Lomenzo, P.D., et al., "Ferroelectric Si-Doped HfO2 Device Properties on Highly Doped Germanium," IEEE Electron Device Letters, vol. 36(8):766-768 (Aug. 2015).
Ma, T.P., and Jin-Ping Han, "Why is Nonvolatile Ferroelectric Memory Field-Effect Transistor Still Elusive?," IEEE Electron Device Letters, vol. 23(7):386-388 (Jul. 2002).
Morita, Y., et al., "Fabrication of Direct-Contact Higher-k HfO2 Gate Stacks by Oxygen-Controlled Cap Post-Deposition Annealing," Jpn. J. Appl. Phys., vol. 50(10S):10PG01 (Oct. 2011).
Morita, Y., et al., "Extremely Scaled (~0:2 nm) Equivalent Oxide Thickness of Higher-k (k=40) HfO2 Gate Stacks Prepared by Atomic Layer Deposition and Oxygen-Controlled Cap Post-Deposition Annealing," Jpn. J. Appl. Phys., vol. 51(2S):02BA04 (Feb. 2012).
Mueller, S., et al., "Reliability Characteristics of Ferroelectric Si:HfO2 Thin Films for Memory Applications," IEEE Transactions on Device and Materials Reliability, vol. 13(1):93-97 (Mar. 2013).
Mueller, S., et al., "Correlation between the Macroscopic Ferroelectric Material Properties of Si:HfO2 and the statistics of 28 nm FeFET Memory Arrays," Ferroelectrics, vol. 497:42-51 (2016).
Mueller, S., et al., "Next-Generation Ferroelectric Memories Based on Fe—HfO2," Joint IEEE International Symposium on the Applications of Ferroelectric (ISAF), International Symposium on Integrated Functionalities (ISIF), and Piezoelectric Force Microscopy Workshop (PFM), pp. 233-236 (2015).
Müller, J., et al., "Ferroelectric Zr0.5Hf0.5O2 Thin Films for Nonvolatile Memory Applications," Applied Physics Letter, vol. 99:112901 (2011).
Müller, J., et al., "Ferroelectricity in HfO2 Enables Nonvolatile Data Storage in 28 nm HKMG," Symposium on VLSI Technology Digest of Technical Papers, pp. 25-26 (Jul. 2012).
Müller, J., et al., "Ferroelectric Hafnium Oxide: A CMOS-Compatible and Highly Scalable Approach to Future Ferroelectric Memories," IEEE International Electron Devices Meeting (Dec. 2013).
Müller, J., et al., "Ferroelectric Hafnium Oxide Based Materials and Devices: Assessment of Current Status and Future Prospects," ECS Journal of Solid State Science and Technology, vol. 4(5):N30-N35 (2015).
Polakowski, P., and J. Müller,, "Ferroelectricity in Undoped Hafnium Oxide," Applied Physics Letters, vol. 106:232905 (2015).
Sakai, S., and R. Ilangovan, "Metal-Ferroelectric-Insulator-Semiconductor Memory FET With Long Retention and High Endurance," IEEE Electron Device Letters, col. 25(6):369-371 (Jun. 2004).
Sakai, S., et al., "Downsizing and Memory Array Integration of Pt/SrBi2Ta2O9/Hf—Al—O/Si Ferroelectric-Gate Field-Effect Transistors," 12th Annual Non-Volatile Memory Technology Symposium (NVMTS) (2012).
Schenk, T., et al., "Strontium Doped Hafnium Oxide Thin Films: Wide Process Window for Ferroelectric Memories," Proceedings of the European Solid-State Device Research Conference (2013 ).
Takahashi, K, et al., "Thirty-Day-Long Data Retention in Ferroelectric-Gate Field-Effect Transistors with HfO2 Buffer Layers," Jpn. J. Appl. Phys., vol. 44(8):6218-6220 (2005).
Yurchuk, E.Y, et al., "Origin of the Endurance Degradation in the Novel HfO2-based 1T Ferroelectric Non-Volatile Memories," IEEE International Reliability Physics Symposium (Jun. 2014).
Zhang, X., et al., "64 kbit Ferroelectric-Gate-Transistor-Integrated NAND Flash Memory with 7.5 V Program and Long Data Retention," Jpn. J. Appl. Phys., vol. 51:04DD01 (2012).

* cited by examiner

INTEGRATED CIRCUIT INCLUDING A FERROELECTRIC MEMORY CELL AND MANUFACTURING METHOD THEREOF

CROSS REFERENCE TO RELATED APPLICATIONS

This application claims foreign priority under 35 U.S.C. § 119(a)-(d) to Application No. DE 102016015010.6 filed on Dec. 14, 2016, the entire contents of which are hereby incorporated by reference.

TECHNICAL FIELD

The invention relates to an integrated circuit including a ferroelectric memory cell comprising a ferroelectric film comprising a binary oxide ferroelectric with the formula $XO_2$, where X represents a transition metal; and to a manufacturing method of the integrated circuit including the memory cell.

BACKGROUND

One typical example for a ferroelectric memory cell is a ferroelectric field-effect transistor, FeFET, memory cell. An FeFET usually has a stacked structure, where at least a bulk material, a ferroelectric film, and a gate electrode are stacked over a substrate. The transistor further comprises a channel region and source and drain regions contacting the channel region. In many cases, the source and drain regions are formed in the same layer as the channel region, for example, by means of doping. Several additional layers may also be provided, for example, a buried oxide over the substrate, interface layers, interlayers, and/or buffer layers.

Ferroelectric field effect transistors based on binary oxide ferroelectrics, for example, ferroelectric $HfO_2$ (FE-$HfO_2$), currently suffer from the drawback of statistical device-to-device variation of memory states. Since the memory states of a ferroelectric field effect transistor are encoded in the threshold voltage shift of the transistor, variation of memory states directly translates to a variation from device-to-device with respect to the value of the threshold voltage for a certain memory state. As an example, for a FeFET device encoding only one bit, the device-to-device variation of memory states is reflected by the device-to-device variation of the low threshold voltage and the high threshold voltage state. For FeFET devices encoding more than one bit per cell the device-to-device variation of memory states corresponds in general to the variations of the different threshold voltage states.

A ferroelectric memory cell may also be provided in the form of a capacitor wherein the ferroelectric is interposed between the two capacitor electrodes. Similar problems arise in memory cells of this type.

Accordingly, there is a need to find what causes the problem and to provide devices with reduced device-to-device variation of memory states.

Therefore, the technical problem underlying the invention is to provide a ferroelectric memory cell with reduced device-to-device variation of memory states.

SUMMARY

The invention provides an integrated circuit including a ferroelectric memory cell comprising a ferroelectric film comprising a binary oxide ferroelectric with the formula $XO_2$ where X represents a transition metal. The ferroelectric film is a polycrystalline film having a plurality of crystal grains, wherein the crystal grains are oriented along a predetermined crystal axis, or that the ferroelectric film is a monocrystalline film, wherein the ferroelectric film comprises additives promoting formation of the crystal structure of the monocrystalline film, and/or wherein the memory cell comprises a crystallinity-promoting layer that is directly in contact with the ferroelectric film and promotes formation of the crystal structure of the monocrystalline film.

The crystal structure of the monocrystalline film may be a result of the additives promoting formation of the monocrystalline film and/or a result of the crystallinity-promoting layer promoting formation of the crystalline structure of the monocrystalline film.

Ferroelectric memory cells, particularly FeFETs, having a ferroelectric film with a polycrystalline film that has a plurality of crystal grains with a common (predetermined) crystal orientation or a monocrystalline film show a significantly decreased statistical device-to-device variation of memory states. Moreover, a monocrystalline structure of the ferroelectric film is promoted by changing the composition of the ferroelectric film to include additives, or by providing crystallinity-promoting layers directly in contact with the ferroelectric film.

Thus, the problem of reducing statistical device-to-device variation of memory states is solved by the claimed integrated circuit.

A polycrystalline film in this application is considered to be a film having a polycrystalline phase. In particular, less than 10%, particularly less than 5%, particularly less than 2% of the polycrystalline film may be in an amorphous phase.

The plurality of crystal grains being oriented along a predetermined crystal axis means that the orientation of the respective (predetermined) crystal axis of each of the plurality of crystal grains is within a cone having an aperture (opening angle) of less than 10°, in particular less than 5°, in particular less than 2°. Note that the crystal orientation can be determined by means of transmission electron microscopy, for example.

The plurality of crystal grains oriented along the predetermined axis comprises at least 50%, in particular at least 60%, in particular at least 70%, of the crystal grains of the polycrystalline film.

Note that in the following, the polycrystalline film having a plurality of crystal grains, wherein the crystal grains are oriented along a predetermined crystal axis, will also be referred to as an "oriented polycrystalline film."

The memory cell may comprise a transistor with a gate electrode and a channel region, wherein the ferroelectric film is interposed between the gate electrode and the channel region. In particular, the memory cell may be a memory cell comprising a ferroelectric field-effect transistor, FeFET, i.e., a FeFET memory cell.

Instead of the ferroelectric field-effect transistor, the memory cell may be comprised of other elements, for example, it may comprise a ferroelectric capacitor (as will be outlined in more detail below). For example, the ferroelectric memory cell may be a FeFET (one transistor, also called "1T"). Alternatively, for example, the ferroelectric memory cell may be a standard transistor coupled to a ferroelectric capacitor (one transistor-one capacitor, also called "1T-1C").

The channel region is at least the (geometric) region where a channel is formed in operation (the zone in which charge carrier inversion is created, i.e. where the amount of minority carriers is larger than the amount of majority carriers). However, the geometric thickness of the channel region shall not be limited to the thickness of the inversion zone and may extend beyond depending on how the channel region is formed technologically (e.g. by deposition, growth, diffusion techniques). The channel region may be formed in the bulk by introducing chemical elements different from the bulk chemical elements, for example by Ge condensation into the silicon bulk. Alternatively, the channel region may be part of the bulk and its material and composition may be the same as that of the remaining parts of the bulk. Alternatively, a channel layer may be interposed between the bulk material and the ferroelectric film. For means of simplifying the following description, the above cases will be summarized with the term "a layer comprising the channel region", such that the layer comprising the channel region may be the (optionally selectively doped) bulk or a channel layer formed over the bulk.

As mentioned above, alternatively to a FeFET, the memory cell may comprise a capacitor with a first capacitor electrode and a second capacitor electrode, wherein the ferroelectric film is interposed between the first capacitor electrode and the second capacitor electrode. Such a capacitor will be referred to as ferroelectric capacitor in the following. That is, the memory cell may be a ferroelectric capacitor memory cell. In addition to the ferroelectric capacitor, the memory cell may comprise other elements, for example, a transistor. Alternatively, the ferroelectric capacitor as such may form the memory cell.

The crystallinity-promoting layer may be the gate electrode and/or a layer comprising the channel region, or at least one of the capacitor electrodes, in case they are directly in contact with the ferroelectric film. The crystallinity-promoting layers may also be additional layers of the memory cell.

The ferroelectric film is used for storing information. For example, in case of a FeFET, in order to write into the memory cell, a sufficiently high voltage is applied to the gate, and the source/drain/bulk regions are kept at voltages levels such that the polarization of the ferroelectric material is changed, i.e., that the coercive field of the ferroelectric is at least overcome. This changes the conductivity of the channel. Accordingly, in order to read from the memory cell, certain voltages can be applied to source, drain, gate and bulk terminals and a current flowing from source to drain or vice versa can be measured without affecting the stored memory state. Thus, the polarization state and, accordingly, the information written in the memory cell can be read out.

In case of a ferroelectric capacitor memory cell, the write operation is similar to the FeFET. That is, a sufficiently high voltage is applied to one of the capacitor electrodes and the other electrode is kept at a voltage level such that the polarization of the ferroelectric material is changed, i.e., that the coercive field of the ferroelectric is at least overcome. However, compared to the FeFET, the read operation is destructive, i.e., a write pulse is applied to one of the electrodes and depending on the polarization state the cell either flips or does not flip its polarization state. If the cell flips, a large current flows, and if it does not flip, a slow current flows. This can be sensed by standard circuit components like a sense amplifier.

The ferroelectric film may be a polar insulator material for which the spontaneous polarization can be reversed by the application of an electric field. As mentioned above, the ferroelectric material is of the group of binary oxide ferroelectrics with the formula $XO_2$, wherein X represents a transition metal. From the group of transition metal oxides X, either hafnium (Hf), zirconium (Zr), or a mixture of both can be chosen. The ferroelectric film may, in particular, reside in an orthorhombic crystal phase of space group $Pca2_1$ or in any crystal phase and space group that is non-centrosymmetric and polar, and in which the spontaneous polarization is reversible by application of an electric field. The described ferroelectric film may be doped in order to obtain ferroelectric properties as described in U.S. Pat. No. 7,709,359 B2.

In particular, the orientation of the crystal grains may be such that the polar axis of the predetermined crystal axis is parallel to the surface normal of the channel region or the first (e.g., the lower) capacitor electrode.

Promoting formation of the crystal structure of the monocrystalline or polycrystalline film may occur during fabrication of the device. Promoting in this application also comprises the situation where the formation of the crystal structure is induced in a ferroelectric material that would not form the respective crystal structure under otherwise identical conditions, i.e., causing the formation of a crystal structure.

In a FeFET, the gate electrode may comprise or consist of a metal, in particular any material that someone skilled in the art utilizes for high-k metal-gate transistors. In particular, the gate electrode may comprise or consist of TiN or TaN. The source and drain regions may be of n-type of p-type depending on the MOSFET (Metal-Oxide-Semiconductor Field-Effect Transistor) type, i.e., n-channel or p-channel MOSFET.

One or both of the capacitor electrodes may comprise or consist of any of the materials described in the context of the gate electrode. Alternatively, one or both of the capacitor electrodes may be formed of a suitably doped semiconductor material that may be similar to the bulk material used for a FeFET.

When the ferroelectric film is the polycrystalline film, the ferroelectric film may comprise additives promoting formation of the crystal structure of the polycrystalline film, and/or the memory cell may comprise a crystallinity-promoting layer that is directly in contact with the ferroelectric film and promotes formation of the crystal structure of the polycrystalline film.

The structure and/or composition of the crystallinity-promoting layer may be configured such that it promotes formation of the monocrystalline film or the polycrystalline film.

The crystallinity-promoting layer may be a buffer layer interposed between the ferroelectric film and the channel region and/or a buffer layer interposed between the ferroelectric film and the gate electrode, or a buffer layer interposed between the ferroelectric film and at least one of the capacitor electrodes, and the buffer layer may have the same or similar crystal structure as the ferroelectric film. A "similar crystal structure" includes the case where the in-plane lattice constants of the buffer layer and the in-plane lattice constants of the ferroelectric film at the interface between buffer layer and ferroelectric film are close to each other, e.g. less than 20% lattice mismatch, in particular less than 15% lattice mismatch, in particular less than 5% lattice mismatch, even if the crystal families (Bravais lattice) of the ferroelectric film and the buffer layer might differ.

In theory, two crystalline materials interfacing each other are completely lattice matched when the lattice constants of the respective materials at that interface are either identical or integer multiples of each other. When two materials are not completely lattice matched but differ in their lattice constants, they only show a certain degree of lattice matching (or mismatching) which, e.g., can be expressed as a fraction of the lattice constants of the respective materials that interface each other. As an example, let material A have a lattice constant a and material B has a lattice constant b. Then the lattice matching in percent can be expressed as (|a-b|/a)*100% or (|b-a|/b)*100% wheras the maximum of the two described fractions should be considered herein.

In case of a polycrystalline ferroelectric film, the buffer layer may also be polycrystalline and may have the predetermined crystal orientation of the crystal grains. That is, a plurality of crystal grains of the buffer layer may be oriented along the predetermined crystal axis. This causes a certain texture, i.e., the orientation of crystal grains in the ferroelectric film. In the buffer layer, the plurality of crystal grains oriented along the predetermined axis comprises at least 50%, in particular at least 60%, in particular at least 70%, of the crystal grains of the buffer layer.

The buffer layer may be arranged below the ferroelectric film or above the ferroelectric film. Moreover, a first buffer layer may be arranged below the ferroelectric film and a second buffer layer may be arranged above the ferroelectric film. In this case, the buffer layers may have the same or different compositions and/or textures.

A buffer layer in the context of this application may be a layer that is not required for the transistor's functionality (unlike the channel, the source, the drain, the gate, and the ferroelectric film) or the capacitor's functionality (unlike the two capacitor electrodes). It is also referred to as a seed layer.

As mentioned above, promoting formation of the crystal structure of the monocrystalline or polycrystalline film may occur during fabrication of the device, in this case, particularly during a heat treatment performed after the ferroelectric film and the buffer layer have been formed.

The buffer layer may comprise a crystalline metal, particularly Pt, TiN, TaN, $In_2O_5Sn$, or $Sr_2RuO_4$. Alternatively, the buffer layer may comprise a crystalline insulator, particularly $Zr_{1-x}Y_xO_2$, $SrTiO_3$, $Al_2O_3$, or $TiO_2$. Alternatively, the buffer layer may comprise a crystalline semiconductor, particularly Ge, $Ge_aSi_{1-a}$, GaN, GaAs, $In_bGa_{1-b}As$, InP, InAs, $In_cAl_{1-c}As$, GaSb, $In_dGa_{1-d}Sb$, AlSb, or InSb.

The layer comprising a channel region may be the crystallinity-promoting layer and the channel region may comprise a material that forms no native oxide or an unstable native oxide, and/or is lattice matched with the material of the ferroelectric film. The term "lattice matched" in the present application may refer to materials interfacing each other and having a lattice mismatch equal to or less than 30%. In particular, the lattice mismatch is equal to or less than 20%, in particular equal to or less than 15%, in particular equal to or less than 5%.

In the currently known FeFETs, the ferroelectric film is generally deposited on top of an amorphous interface or on top of an amorphous buffer layer. These interfaces/layers are usually oxides, and in the case of the interface, native oxides. The presence of this kind of oxide may cause the ferroelectric film to crystallize in a polycrystalline manner, which leads to grains with rather arbitrary crystal orientations. As outlined above, this increases device-to-device variation of memory states. Moreover, a mixture of crystal phases can occur, where some grains do not reside in the ferroelectric crystal phase. This also increases device-to-device variation of memory states.

When the channel region is in contact with the ferroelectric film and when using a material that does not form a native oxide interface for the channel region, the growth of the ferroelectric film is homogenous and aligned to the crystal orientation of the channel region. Thus, a monocrystalline/epitaxial growth of the ferroelectric film can be achieved. Accordingly, device-to-device variation of memory states is decreased.

For many materials, after film formation, an oxide is formed on the surface of the film even without any dedicated oxide formation step. Such an oxide is called a native oxide and may occur due to reactions of the materials of the film with elements of the atmosphere (like oxygen) to which the film is exposed. The above-mentioned term "unstable native oxide" in this context means that the chemical potential for forming the oxide again is lower than the chemical potential for forming silicon dioxide on a silicon bulk substrate under the same ambient conditions. Thus, the native oxide can be removed easily (e.g., by wet or dry etching), such that the removal can be performed in an acceptable time frame.

The semiconductor material of the channel region (also called semiconducting template material) may comprise any one of Ge, $Ge_xSi_{1-x}$, GaN, GaAs, $In_xGa_{1-x}As$, Si, InP, InAs, $In_xAl_{1-x}As$, GaSb, $In_xGa_{1-x}Sb$, AlSb, InSb, or a combination of one or more of these materials. In particular, one of Ge, $Ge_xSi_{1-x}$, GaN, Si may be used. Germanium is particularly suitable for use as a material for the channel region, since it provides the ability for interface-free ferroelectric film growth.

The ferroelectric film and/or the crystallinity-promoting layer may comprise a scavenging material configured to avoid interface formation and/or promote epitaxial growth of the ferroelectric film. In this context a scavenging material is a material that has a higher chemical affinity to form a chemical compound than the bulk material on top of which a chemical compound like an interface (e.g., a native oxide) might form. In particular the scavenging material shall have a higher oxygen affinity than the bulk material when interfacial oxide formation is considered.

This is particularly useful when it is not possible to use an appropriate channel material that does not form a native oxide. For example, in a silicon CMOS (Complementary Metal-Oxide-Semiconductor) process, the use of such materials may not be possible or may be technically complex. The use of a scavenging material allows for the ferroelectric film to be grown epitaxially in spite of this. In particular, a scavenging material may avoid the amorphous $SiO_2$ interface growth that usually occurs during silicon CMOS processing.

The gate electrode or at least one of the capacitor electrodes may be the crystallinity-promoting layer and comprise the scavenging material. Alternatively, a layer interposed between the ferroelectric film and the gate electrode or a layer interposed between the ferroelectric film and at least one of the capacitor electrodes may be the crystallinity-promoting layer and comprise the scavenging material.

As can be seen above, direct scavenging, where the scavenging material is comprised in the ferroelectric film itself, or remote scavenging, where the scavenging material is comprised in a layer that is in contact with the ferroelectric film, may be applied.

For example, the scavenging material may be deposited on top of a ferroelectric film, or included in the gate electrode or in at least one of the capacitor electrodes or in the ferroelectric film itself.

It is also possible that a layer interposed between the channel region and the ferroelectric film comprises the scavenging material.

The scavenging material may comprise any one of Ti, TiN, doped TiN, Ta, TaN, Hf, non-stoichiometric $HfO_2$, Zr, non-stoichiometric ZrO2, C, W, La, Al, and/or a material, particularly metal, having higher oxygen affinity than the substrate material, the elements in the channel region, the source region, the drain region, and the ferroelectric film. These materials are particularly advantageous when they are incorporated into the gate metal. In particular, one of Ti, Ta, Hf, Zr, C, La may be used. Moreover the higher the oxygen affinity, the more suitable are the materials.

In particular, when combining one of the above scavenging materials with a ferroelectric film of $HfO_2$, epitaxial growth of the ferroelectric film is induced, thereby reducing device-to-device variations of FeFETs or ferroelectric capacitors.

The ferroelectric film may comprise additives, and/or a crystallinity-promoting layer or the crystallinity-promoting layer may be configured to promote the homogeneity of the crystal phase of the ferroelectric film.

In particular, at least 60%, particularly at least 70%, particularly at least 80%, particularly at least 90% of the crystals of the ferroelectric film may be in the ferroelectric crystal phase.

The layer comprising the channel region may be the crystallinity-promoting layer and the layer comprising the channel region, in particular the channel region, may have a configuration or structure as outlined above. This is suitable for providing a homogenous crystal phase in the ferroelectric film.

The FeFET may be configured as Gate-First, Gate-Last, Replacement-Gate, Full-Replacement-Gate, Partially Depleted SOI (Silicon-on-Insulator), FDSOI (Fully-Depleted Silicon-On-Insulator), Tri-Gate, FinFET (Fin Field Effect Transistor), Gate-all-around or Nanowire device.

The invention also provides a method for manufacturing an integrated circuit including a ferroelectric memory cell, particularly a memory cell as described above.

The method for manufacturing the integrated circuit including the ferroelectric memory cell comprises the step of forming a polycrystalline ferroelectric film having a plurality of crystal grains, wherein the crystal grains are oriented along a predetermined crystal axis, or a monocrystalline ferroelectric film, wherein the ferroelectric film comprises a binary oxide ferroelectric with the formula $XO_2$, where X represents a transition metal.

The monocrystalline ferroelectric film comprises additives promoting formation of the crystal structure of the monocrystalline ferroelectric film, and/or is formed directly in contact with a crystallinity-promoting layer that promotes formation of the crystal structure of the monocrystalline ferroelectric film.

The polycrystalline ferroelectric film may comprise additives promoting formation of the crystal structure of the polycrystalline ferroelectric film, and/or may be formed directly in contact with a crystallinity-promoting layer that promotes formation of the crystal structure of the polycrystalline ferroelectric film.

The memory cell may comprise a transistor, in particular, a ferroelectric field-effect transistor, FeFET, and may comprise the steps of forming a channel region; forming a source region and a drain region; and forming a gate electrode such that the ferroelectric film is interposed between the gate electrode and the channel region. The crystallinity-promoting layer may be provided as an additional layer or as a layer comprising the channel region and/or the gate electrode.

Alternatively, the memory cell may comprise a, particularly ferroelectric, capacitor and may include the steps of forming a first capacitor electrode, forming the ferroelectric film over the first capacitor electrode, and forming a second capacitor electrode over the ferroelectric film. The crystallinity-promoting layer may be provided as an additional layer or as at least one of the capacitor electrodes.

The method may comprise a heat treatment performed during or after the formation of the ferroelectric film so as to crystallize the ferroelectric film, in particular, a heat treatment performed before or after formation of the gate electrode or after the formation of the second capacitor electrode.

It should be noted that features and advantages described in the context of the integrated circuit, particularly the memory cell, equally apply to the manufacturing method, and the features of the manufacturing method can be freely combined with the features of the integrated circuit, particularly the memory cell.

BRIEF DESCRIPTION OF THE DRAWINGS

Advantageous embodiments will now be described in combination with the enclosed figures.

DETAILED DESCRIPTION

The invention provides an integrated circuit including a ferroelectric memory cell. An integrated circuit may comprise a plurality of circuit elements that are provided on a single chip. The circuit elements may comprise memory cells, for example.

Different kinds of memory cells may be used in an integrated circuit, in particular, memory cells comprising or consisting of a ferroelectric transistor or a ferroelectric capacitor. The figures show configurations of different kinds of memory cells that can be used in integrated circuits.

Figure 1:
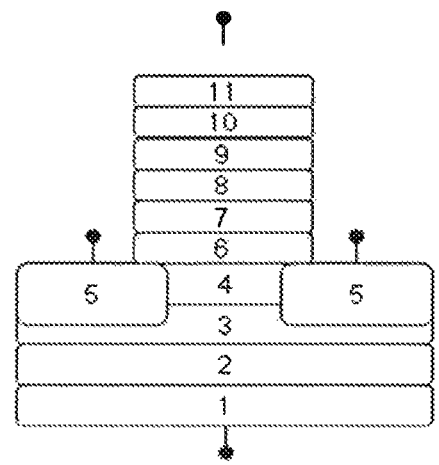
FIG. 1 shows a general configuration of a FeFET transistor.

FIG. 1 shows a general configuration of an FeFET memory cell of an integrated circuit, in particular, a 1T memory cell. The transistor comprises a substrate 1, for example, a semiconductor substrate, an insulating layer 2 over the substrate, for example, a buried oxide, a bulk 3 over the insulating layer, a channel region 4, source and drain regions 5 contacting the channel region, an interface 6, a first buffer layer 7, a ferroelectric film 8, a second buffer layer 9, a gate electrode 10, and, for example, a polycrystalline silicon gate 11. The channel region, the source region, and the drain region may each be formed in the bulk (as indicated in the figure) or in a separate layer on top of the bulk. As mentioned above, when the channel region is formed in the bulk, the bulk is the layer comprising the channel region.

Note that several of these layers may be omitted, for example, one or more of the buried oxide, the interface, and one or both of the buffer layers. For example, the substrate does not have to be a semiconductor substrate. In particular, an insulating substrate may be used. In that case, the insulating layer (e.g., the buried oxide) may be omitted. Moreover, more than one ferroelectric film may be provided, separated by interlayers.

The bulk may be a semiconductor bulk, for example silicon. The buffer layer may be an insulator, particularly an insulator that is configured to reduce charge injection and/or to reduce mixing of materials between the ferroelectric film and other layers, e.g., the gate electrode or the channel region, and/or to strengthen the field over the ferroelectric film.

In the following embodiments, layers or regions shown in FIG. 1 are designated with the same reference signs as in FIG. 1, even though their composition and structure may be different in the different embodiments.

Figure 2A:
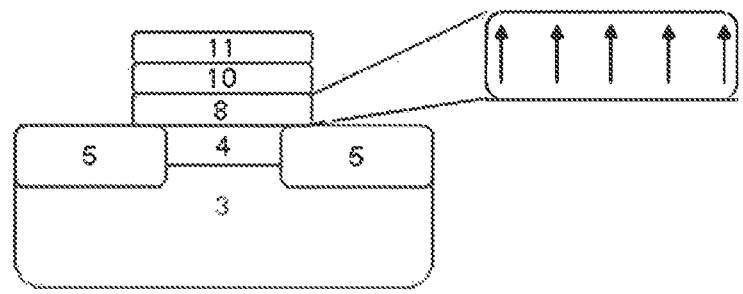
FIG. 2a shows a schematic representation of a FeFET transistor.

FIG. 2a shows an exemplary FeFET transistor that can form or be part of a memory cell of an integrated circuit according to a first embodiment. That is, the memory cell may comprise or consist of such a transistor.

In the present case, the source and drain regions are formed in the same layer as the channel region. In particular, in this example, they are formed in the bulk. The source and drain regions are doped with respective dopants. Alternatively, it would also be possible that the channel region and the source and drain regions are formed in a layer deposited on the bulk, for example.

The material of the ferroelectric film in this case is $HfO_2$. However, any other binary oxide ferroelectric with the formula $XO_2$ wherein X represents that a transition metal may be used.

The gate electrode may be made of metal, for example TiN or TaN, or any material that someone skilled in the art utilizes for high-k metal-gate transistors.

In this embodiment, as can be seen from the figure, the ferroelectric film 8 is in direct contact with the channel region 4. That is, there is no interface or first buffer layer. Moreover, the gate electrode 10 is directly in contact with the ferroelectric film. That is, there is no second buffer layer.

The channel material may be a material that does not form a stable native oxide, for example Germanium, and promotes a monocrystalline or an oriented polycrystalline structure of the ferroelectric film. That is, the ferroelectric film is formed directly in contact with a crystallinity-promoting layer, in this case the layer in which the channel region is formed.

Optionally, the channel region may have the predetermined crystal orientation as the ferroelectric and/or a low lattice mismatch with respect to the ferroelectric.

As an example, the film thickness of the ferroelectric film may be in the range of 1 to 30 nm, in particular, in the range of 4 to 15 nm. Moreover, the gate metal thickness may be in the range of 0.5 to 30 nm, in particular in the range of 1 to 10 nm, for example. The thickness of the channel region can be in the range of 1 to 50 nm, in particular in the range of 5 to 30 nm. The top electrode thickness may induce stress from compressive to tensile depending on the thickness. In the light of this, the above-mentioned thickness is preferable. In particular, the thickness of the channel region is chosen such that the lattice mismatch to the ferroelectric film is as small as possible.

In FIG. 2a, the ferroelectric film is depicted as a monocrystalline layer with no grain boundaries. However, the ferroelectric film may also be a polycrystalline film having a plurality of crystal grains, wherein the crystal grains are oriented along a predetermined crystal axis. That is, the crystal grains have a common (predetermined) orientation.

In general, any combination of the above-mentioned materials is possible. In the following, some specific exemplary material combinations will be given.

An exemplary combination of materials is a polysilicon gate 11, a TiN metal gate 10, a silicon doped hafnium oxide as ferroelectric 8, a pure Germanium or SiGe channel region 4 on top of a silicon bulk 3. This is, e.g., suitable for a gate first process flow.

Another exemplary combination of materials is an aluminum gate 11, a TiN metal gate 10, a hafnium oxide/zirconium oxide solid solution (e.g., 1:1 mixing ratio) as ferroelectric 8, a pure Germanium or SiGe channel region 4 on top of a silicon bulk 3. This is, e.g., suitable for a gate last process flow.

For an FDSOI technology platform, the above mentioned example can be used whereas the bulk 3 can also consist of Germanium (i.e., no difference in materials between bulk and channel region). The buried oxide 2 could be silicon dioxide and the substrate 1 would be silicon.

Another exemplary combination of materials is a polysilicon gate 11, a TaN metal gate 10, a lanthanum doped hafnium oxide as ferroelectric 8, a pure Germanium or SiGe channel region 4 on top of a silicon bulk 3. This is, e.g., suitable for a gate first process flow.

Figure 2B:
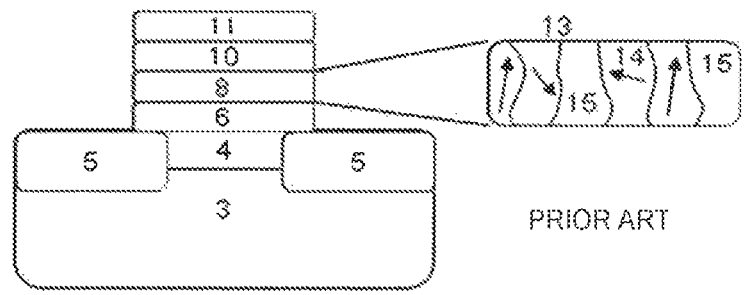
FIG. 2b shows another schematic representation of a FeFET transistor.

FIG. 2b shows a structure as known from the prior art. The structure is similar to the FeFET of FIG. 2a. However, an interface 6 (for example an amorphous native oxide) is interposed between the ferroelectric film 8 and the channel region 4. This interface leads to a polycrystalline ferroelectric film having grain boundaries 13 and random crystal orientations 14, and with an inhomogeneous crystal phase (indicated by crystals 15 not being in the ferroelectric crystal phase).

According to a second embodiment (not shown in an additional figure), the memory cell has at least a channel region 4, source and drain regions 5, a ferroelectric film 8, and a gate metal 10. The gate metal is in direct contact with the ferroelectric film.

Moreover, one or more additional elements chosen from the different elements shown FIG. 1, may optionally be part of the memory cell, for example, a substrate 1, an insulating layer 2 over the substrate, a bulk 3, an interface 6, a first buffer layer 7, and/or a polycrystalline silicon gate 11. For a Gate-Last device, the polycrystalline silicon gate may be replaced by an aluminum gate.

In this embodiment, gate metal 10 comprises a scavenging material and acts as a crystallinity-promoting layer.

For example Ti, TiN, doped TiN, Ta, TaN, Hf, non-stoichiometric $HfO_2$, C, W, La, Al may be used as scavenging materials. Preferably, one of Ti, Ta, Hf, Zr, C, La is used. Generally, a material, particularly metal, having higher oxygen affinity than the substrate material, the elements in the channel region, the source region, the drain region, and the ferroelectric film is suitable as scavenging material.

Similarly to the first embodiment, the ferroelectric film may be a monocrystalline layer with no grain boundaries. However, the ferroelectric film may also be a polycrystalline film having a plurality of crystal grains, wherein the crystal grains are oriented along a predetermined crystal axis.

In this embodiment, other structures are conceivable as long as the layer directly in contact with the ferroelectric film, for example, a buffer layer or an interface of the ferroelectric film comprises the scavenging material (remote scavenging). The layer that is directly in contact with the ferroelectric film and comprises the scavenging material acts as the crystallinity-promoting layer.

In addition or alternatively to providing a crystallinity-promoting layer comprising a scavenging material, the ferroelectric film itself may comprise the scavenging material, for example, as an additive (direct scavenging).

Figure 3:
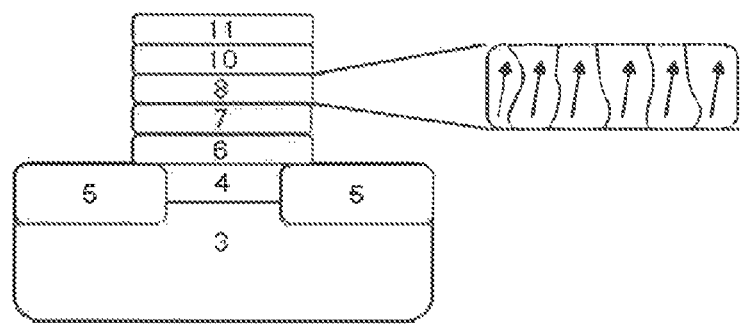
FIG. 3 shows another schematic representation of a FeFET transistor.

FIG. 3 shows an exemplary FeFET that can form or be part of a memory cell of an integrated circuit according to a third embodiment.

In this embodiment, an interface 6 and a buffer layer 7 are interposed between the channel region and the ferroelectric film 8. The buffer layer is directly in contact with the ferroelectric film. This buffer layer is used as a seed layer and is configured such that it promotes the crystal orientation in the ferroelectric film, i.e., it is a crystallinity-promoting layer.

The buffer layer is a monocrystalline or a polycrystalline layer having a plurality of crystal grains, wherein the crystal grains are oriented along a predetermined crystal axis, and the crystal orientation of the monocrystalline buffer layer or the orientation of the predetermined crystal axis of the polycrystalline buffer layer is the same as the orientation of the ferroelectric film. In FIG. 3, the ferroelectric film has a polycrystalline structure, wherein the crystal grains are oriented along a predetermined crystal axis, for example.

In general, any combination of the above-mentioned materials is possible. In the following, some specific exemplary material combinations will be given.

An exemplary combination of materials is a polysilicon gate 11, a TiN metal gate 10, a silicon doped hafnium oxide as ferroelectric 8, a TiN seed layer with a preferred crystal orientation 7, a (nitrided) $SiO_2$ interface 6 on top of a silicon channel 4 and bulk 3 region.

Another exemplary combination of materials is a polysilicon gate 11, a TiN metal gate 10, a silicon doped hafnium oxide as ferroelectric 8, a platinum seed layer 7, a (nitrided) $SiO_2$ interface 6 on top of a silicon channel 4 and bulk 3 region.

A first fabrication method according to the present invention will be described in the following. This fabrication method may be used to obtain the memory cell of FIG. 2a, for example.

An insulating layer is formed over a substrate using any known method and subsequently, a bulk material is deposited over the insulating layer using any known method. The insulating layer may be omitted in case the substrate itself has insulating properties.

Afterwards, a channel region is formed. The channel region may be formed, for example, by Germanium condensation into an Si-bulk. Alternatively, the channel region may be formed by epitaxial growth of the channel material. That way, a completely different channel material as compared to the bulk material can be used. The epitaxial growth of a different channel material can be achieved by atomic layer deposition, physical vapor deposition like sputter deposition, pulsed laser deposition, chemical vapor deposition, molecular beam epitaxy or any other deposition method suitable for epitaxial growth.

Preferably but not necessarily, the channel region may be formed in an oriented polycrystalline or in a monocrystalline crystal structure or may obtain such a crystal structure before a ferroelectric is deposited on the channel region. Alternatively or in addition, the channel material may have low lattice mismatch with respect to the ferroelectric material that will be deposited on top of the channel region.

For example, the materials mentioned in the first embodiment making reference to FIG. 2a may be used for the substrate, insulating layer, bulk, channel region and source and drain regions. In particular, the channel region may comprise a material that does not form a native oxide or that only forms an unstable native oxide.

Optionally, after forming the bulk and the channel region, a cleaning step, for example, a hydrogen fluoride (HF) etching step, can be performed in order to remove oxide residuals and/or the unstable native oxide that might have formed on the surface of the channel region. The cleaning step is not limited to HF etching and a person skilled in the art would be aware of various ways to remove the oxide over the channel region. For example, this can be done by wet chemical processing or by dry etching.

Next, a ferroelectric film is formed. The film may be formed by atomic layer deposition, physical vapor deposition, chemical solution deposition, metal organic chemical vapor deposition, pulsed laser deposition, or any other deposition method suitable for forming a ferroelectric film. The materials outlined above in the context of embodiment 1 may be used, for example.

The crystallization into the ferroelectric phase and formation of a monocrystalline or oriented polycrystalline crystal structure of the ferroelectric film may be achieved in one or more steps that may include the film formation of the ferroelectric film and/or one or more annealing steps following the film formation, for example.

As an example, the deposition temperature may be chosen such that crystallization into the ferroelectric phase and/or the formation of a polycrystalline or monocrystalline crystal structure in the ferroelectric film is at least partially achieved during deposition. In case the crystallization into the ferroelectric phase and/or the formation of the crystal structure are not or not entirely achieved during the deposition, they may be achieved or completed after the deposition, for example, via an anneal, e.g., a post-metallization anneal (anneal after deposition of a top electrode).

After formation of the ferroelectric film, an annealing step may optionally be performed. For example, this may at least partially achieve, particularly complete, crystallization into the ferroelectric phase and/or formation of the polycrystalline or monocrystalline crystal structure. The annealing step may comprise rapid thermal processing, RTP, spike annealing, laser annealing, or any other thermal step that surpasses the crystallization temperature of the ferroelectric film. The annealing step may be performed in various environments, such as nitrogen or oxygen atmospheres. This annealing step may also be omitted.

Next, in order to form a gate electrode, a gate metal is deposited by similar deposition methods as described for the deposition of the ferroelectric film.

Accordingly, the ferroelectric film is interposed between and directly in contact with the gate electrode and the channel region.

After formation of the gate metal, an annealing step may optionally (alternatively or in addition to an annealing step performed before deposition of the gate metal) be performed. This may at least partially achieve, and particularly complete, crystallization into the ferroelectric phase and/or formation of the polycrystalline or monocrystalline crystal structure. The annealing step may comprise rapid thermal processing spike annealing, laser annealing, or any other thermal step that surpasses the crystallization temperature of the ferroelectric film. The annealing step may be performed in various environments, such as nitrogen or oxygen atmospheres. Methods of annealing such a stack are known to a person skilled in the art. This annealing step may also be omitted.

After formation of the gate metal, and if applicable, after the annealing step, a polycrystalline silicon gate is formed, for example, according to the standard CMOS baseline flow.

The fabrication process may comprise patterning of one or more of the layers deposited during the fabrication. The skilled person would be aware of suitable patterning steps known in the art.

After patterning, source and drain regions are formed, for example, by well-known doping steps in the bulk. Moreover, source and drain regions may also be formed by, e.g., silicidation.

The ferroelectric film resulting when using the above method may be monocrystalline or an oriented polycrystalline film depending on the materials used and/or the crystal structure of the channel region.

A second fabrication method of an FeFET of an integrated circuit according to the present invention will be described below.

This fabrication method results in an FeFET having a layer comprising a scavenging material, e.g., the structure of the second embodiment. Materials for the different layers may, for example, be chosen from the materials described in the context of the first and second embodiments. Scavenging materials may be chosen from the materials described in the context of the second embodiment, for example.

Suitable methods for forming the device having a layer comprising a scavenging material are very similar to methods described in the context of the first method explained above. In the following, only those process steps that differ from the first method will be described.

The differences compared to first method result from steps used to include and optionally activate the scavenging material in the respective layer.

First, including the scavenging material in the ferroelectric film will be described. This is referred to as direct scavenging. The method of including the scavenging material depends on the formation method of the ferroelectric film.

If the ferroelectric film is deposited via atomic layer deposition, where a precursor source is used for depositing the ferroelectric material, the scavenging materials may be incorporated into the film by an additional precursor source that is pulsed in between the precursor pulses that lead to the formation of the ferroelectric material. That is, the scavenging material is included in situ by change of precursor pulses.

If the ferroelectric film is deposited via physical vapor deposition, the scavenging materials may be incorporated into the film via co-sputtering, i.e., by sputtering an additional target of the scavenging material during deposition of the ferroelectric film.

Alternatively, the scavenging materials may be incorporated into the ferroelectric film after formation of the ferroelectric film, for example, by implantation.

The skilled person will be aware of different methods for doping the ferroelectric film ex situ or in situ depending on the deposition method used.

A scavenging material may also be deposited on top of the ferroelectric film or comprised in a layer that is directly in contact with the ferroelectric film, for example, the gate metal. This is referred to as remote scavenging.

The deposition of a scavenging material on top of the ferroelectric film may be achieved by various methods of film deposition known to a person skilled in the art, for example, atomic layer deposition, ALD, physical vapor deposition, PVD, or chemical vapor deposition, CVD.

The incorporation of the scavenging material into other layers, e.g., the gate metal, can be achieved in a similar manner as described for the incorporation of the scavenging material into the ferroelectric film.

After providing the scavenging material (either directly or remotely), a subsequent thermal annealing step is performed. This annealing step leads to the elimination of the interfacial oxide by means of a scavenging process. That is, oxygen diffuses away from the interface and to the scavenging material. This may be a dedicated annealing step for the scavenging process or may be a thermal treatment used for other purposes in generally known semiconductor processing, e.g., source/drain junction activation.

The fabrication methods described above may be applied to the fabrication of the FeFET of the third embodiment as well. However, the removal of an interface may be omitted and the buffer layer may be deposited using any method known to the skilled person for depositing seed layers of the specific material with the required crystal orientation.

That is, the seed layer is grown to have an oriented polycrystalline crystal structure or a monocrystalline crystal structure and/or such a crystal structure is obtained by a treatment of the seed layer, e.g., a heat treatment, before the ferroelectric is deposited on the seed layer.

The crystal orientation of the seed layer, on which the ferroelectric film is deposited, promotes the formation of a monocrystalline or oriented polycrystalline crystal structure within the ferroelectric film. This formation may be achieved in one or more steps that may include the film formation of the ferroelectric film and/or one or more annealing steps following the film formation, for example.

Figure 4:
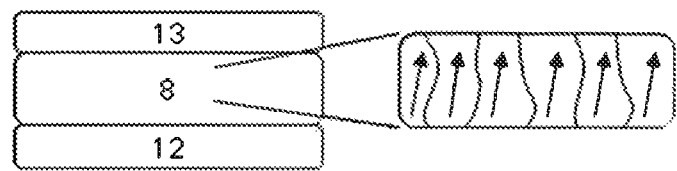
FIG. 4 shows a schematic representation of a ferroelectric capacitor.

FIG. 4 shows a schematic representation of a ferroelectric capacitor of an integrated circuit according to a fourth embodiment. In this case, the ferroelectric film 8 is in direct contact with two capacitor electrodes 12 and 13 and is a polycrystalline film having a plurality of crystal grains, wherein the crystal grains are oriented along a predetermined crystal axis. Alternatively, the ferroelectric film may be a monocrystalline film.

In general, any combination of materials outlined in the context of the transistors (for corresponding elements) is possible. In the following, some specific exemplary material combinations for a ferroelectric capacitor will be given.

An exemplary combination of materials is a TiN top electrode 13, a silicon doped hafnium oxide as ferroelectric 8 and a TiN seed layer with a preferred crystal orientation 12. This can be a capacitor implementation, e.g., used for trench capacitor process flows.

Another exemplary combination of materials is a highly-doped polysilicon top electrode 13, a silicon doped hafnium oxide as ferroelectric 8 and a highly doped polysilicon or silicon bottom electrode 12. This can be a capacitor implementation, e.g., used for a planar capacitor process flow.

Another exemplary combination of materials is a TiN top electrode 13, a hafnium oxide/zirconium oxide solid solution (1:1 mixing ratio) as ferroelectric 8 and a TiN seed layer with a preferred crystal orientation 12. This can be a capacitor implementation, e.g., used for stacked capacitor process flows.

Another exemplary combination of materials is a TaN top electrode 13, a hafnium oxide/zirconium oxide solid solution (1:1 mixing ratio) as ferroelectric 8 and a TaN seed layer with a preferred crystal orientation 12. This can be a capacitor implementation, e.g., used for stacked capacitor process flows.

Although the previously discussed embodiments and examples of the present invention have been described separately, it is to be understood that some or all of the above-described features can also be combined in different ways. The above discussed embodiments are particularly not

What is claimed is:

1. An integrated circuit comprising:
a ferroelectric memory cell comprising a ferroelectric film comprising a binary oxide ferroelectric with a formula $XO_2$, where X represents a transition metal, wherein:
the ferroelectric film is a polycrystalline film having crystal grains, wherein at least 50% of the crystal grains are oriented along a predetermined common crystal axis such that the orientation of a crystal axis of a crystal grain is within a cone having an aperture of less than 10 degrees, or
the ferroelectric film is a monocrystalline ferroelectric film, wherein:
the monocrystalline ferroelectric film includes: a scavenging material promoting formation of a crystal structure of the monocrystalline ferroelectric film; and
a crystallinity-promoting layer between the monocrystalline ferroelectric film and an electrode, the crystallinity-promoting layer comprising a scavenger material that is directly in contact with the monocrystalline ferroelectric film and promotes formation of a crystal structure of the monocrystalline ferroelectric film, and wherein the crystallinity-promoting layer has in-plane lattice constants that have less than a 20% lattice mismatch with in-plane lattice constants of the monocrystalline ferroelectric film at an interface between the crystallinity promoting layer and the monocrystalline ferroelectric film.

2. The integrated circuit of claim 1, wherein:
the ferroelectric memory cell comprises a ferroelectric field-effect transistor (FeFET) formed on a substrate, wherein the FeFET comprises the electrode as a gate electrode and a channel region, the ferroelectric film being interposed between the gate electrode and the channel region; or
the ferroelectric memory cell comprises a capacitor formed on a substrate, wherein the capacitor comprises the electrode as one of a first capacitor electrode and a second capacitor electrode, the ferroelectric film being interposed between the first capacitor electrode and the second capacitor electrode.

3. The integrated circuit of claim 1, wherein:
the ferroelectric film is the polycrystalline film; and
the ferroelectric film comprises scavenging material promoting formation of a crystal structure of the polycrystalline film; and/or
the ferroelectric memory cell comprises a crystallinity-promoting layer that is directly in contact with the ferroelectric film and promotes formation of the crystal structure of the polycrystalline film.

4. The integrated circuit of claim 1, wherein when the ferroelectric film is a polycrystalline film, the polycrystalline film further comprises a crystallinity-promoting layer that has a structure and/or composition that promotes formation of the polycrystalline film.

5. The integrated circuit of claim 2, wherein the channel region comprises a crystallinity-promoting layer and the channel region comprises a material that forms no native oxide or no stable native oxide and/or is lattice matched with the ferroelectric film.

6. The integrated circuit of claim 2, wherein a semiconductor material of the channel region comprises any one of Ge, $Ge_xSi_{1-x}$, GaN, GaAs, $In_xGa_{1-x}As$, Si, InP, InAs, $In_xAl_{1-x}As$, GaSb, $In_xGa_{1-x}Sb$, AlSb, InSb, or any combination thereof.

7. The integrated circuit of claim 2, wherein the scavenging material is configured to avoid interface formation and/or to promote epitaxial growth of the ferroelectric film.

8. The integrated circuit of claim 7, wherein the gate electrode or at least one of the first and second capacitor electrodes comprises the scavenging material.

9. The integrated circuit of claim 7, wherein the scavenging material comprises any one of Ti, TiN, doped TiN, Ta, TaN, Hf, non-stoichiometric $HfO_2$, C, W, La, Al, and/or a material, particularly a metal, having higher oxygen affinity than a material of the substrate, a material in the channel region and a material in the ferroelectric film.

10. The integrated circuit of claim 1, wherein the ferroelectric film comprises the scavenging material or the crystallinity-promoting layer is configured to promote homogeneity of a crystal phase of the ferroelectric film.

11. A method for manufacturing an integrated circuit including a ferroelectric memory cell comprising:
forming a polycrystalline ferroelectric film having crystal grains, wherein at least 50% of the crystal grains are oriented along a predetermined common crystal axis such that the orientation of a crystal axis of a crystal grain is within a cone having an aperture of less than 10 degrees, or a monocrystalline ferroelectric film,
wherein each of the polycrystalline ferroelectric film and the monocrystalline ferroelectric film comprises a binary oxide ferroelectric with a formula $XO_2$, where X represents a transition metal; and
wherein the monocrystalline ferroelectric film includes a scavenging material promoting formation of a crystal structure of the monocrystalline ferroelectric film and is formed directly in contact with a crystallinity-promoting layer, interposed between the monocrystalline ferroelectric film and an electrode, including the scavenging material that promotes formation of the crystal structure of the monocrystalline ferroelectric film, and wherein the crystallinity-promoting layer has in-plane lattice constants that have less than a 20% lattice mismatch with in-plane lattice constants of the monocrystalline ferroelectric film at an interface between the crystallinity promoting layer and the monocrystalline ferroelectric film.

12. The method of claim 11, wherein the polycrystalline ferroelectric film comprises a scavenging material promoting formation of a crystal structure of the polycrystalline ferroelectric film and/or is formed directly in contact with a crystallinity-promoting layer that promotes formation of the crystal structure of the polycrystalline ferroelectric film.

13. The method of claim 11, wherein:
the ferroelectric memory cell comprises a transistor formed on a substrate and wherein the method further comprises forming a channel region and forming the electrode comprises forming a gate electrode such that the ferroelectric film is interposed between the gate electrode and the channel region, wherein the channel region and/or the gate electrode comprises a crystallinity promoting layer, or
the ferroelectric memory cell comprises a capacitor formed on a substrate and wherein the method further comprises forming the electrode comprises forming a first capacitor electrode and forming a second capacitor electrode such that the ferroelectric film is interposed between the first capacitor electrode and the second capacitor electrode, wherein one of the first capacitor electrode and the second capacitor electrode comprises a crystallinity-promoting layer.

14. The method of claim 13, comprising a heat treatment performed during or after the formation of the ferroelectric film so as to crystallize the ferroelectric film, wherein the heat treatment is performed before or after formation of the gate electrode or the second capacitor electrode.

* * * * *